United States Patent
Haag et al.

(10) Patent No.: US 8,461,957 B2
(45) Date of Patent: Jun. 11, 2013

(54) IN-MOLDED RESISTIVE AND SHIELDING ELEMENTS

(75) Inventors: Ronald H. Haag, Lake Orion, MI (US); Jeffrey R. Engel, West Bloomfield, MI (US); William W. Boddie, Jr., Ann Arbor, MI (US)

(73) Assignee: Ink-Logix, LLC, Royal Oak, MI (US)

( * ) Notice: Subject to any disclaimer, the term of this patent is extended or adjusted under 35 U.S.C. 154(b) by 0 days.

(21) Appl. No.: 13/473,301

(22) Filed: May 16, 2012

(65) Prior Publication Data
US 2012/0223805 A1 Sep. 6, 2012

Related U.S. Application Data

(63) Continuation of application No. 12/191,825, filed on Aug. 14, 2008, now Pat. No. 8,198,979, which is a continuation-in-part of application No. 12/106,250, filed on Apr. 18, 2008.

(60) Provisional application No. 60/925,421, filed on Apr. 20, 2007.

(51) Int. Cl.
*H01C 1/028* (2006.01)

(52) U.S. Cl.
USPC .......... 338/248; 338/250; 338/226; 174/257; 361/761

(58) Field of Classification Search
USPC .... 338/248, 250, 226, 334, 64; 174/225–227; 361/761–763, 779
See application file for complete search history.

(56) References Cited

U.S. PATENT DOCUMENTS

| | | | |
|---|---|---|---|
| 3,757,322 A | 9/1973 | Barkan et al. |
| 4,228,330 A | 10/1980 | Larson |
| 4,293,987 A | 10/1981 | Gottbreht et al. |
| 4,353,056 A | 10/1982 | Tsikos |
| 4,367,385 A | 1/1983 | Frame |
| 5,220,488 A | 6/1993 | Denes |
| 5,274,198 A | 12/1993 | Landmeier |
| 5,942,733 A | 8/1999 | Allen et al. |
| 5,999,083 A | 12/1999 | Kordecki |
| 6,354,872 B1 | 3/2002 | Lilienthal, II et al. |
| 6,370,965 B1 | 4/2002 | Knapp |
| 6,382,030 B1 | 5/2002 | Kihara et al. |
| 6,440,642 B1 | 8/2002 | Shelnut et al. |

(Continued)

FOREIGN PATENT DOCUMENTS

| CN | 2105752 U | 5/1992 |
|---|---|---|
| EP | 0304112 A2 | 2/1989 |

(Continued)

OTHER PUBLICATIONS

Office Action from Chinese Application No. 2008-80129510.1 dated Dec. 6, 2011.

(Continued)

*Primary Examiner* — Kyung Lee
(74) *Attorney, Agent, or Firm* — Lerner, David, Littenberg, Krumholz & Mentlik, LLP

(57) ABSTRACT

An article of manufacture having an in-molded resistive and/or shielding element and method of making the same are shown and described. In one disclosed method, a resistive and/or shielding element is printed on a film. The film is formed to a desired shape and put in an injection mold. A molten plastic material is introduced into the injection mold to form a rigid structure that retains the film.

8 Claims, 11 Drawing Sheets

U.S. PATENT DOCUMENTS

| | | |
|---|---|---|
| 6,667,563 B2 | 12/2003 | Bae et al. |
| 7,027,038 B2 | 4/2006 | Carro |
| 7,348,898 B2 | 3/2008 | Ono |
| 7,518,381 B2 | 4/2009 | Lamborghini et al. |
| 2003/0015522 A1 | 1/2003 | Parker et al. |
| 2003/0122794 A1 | 7/2003 | Caldwell |
| 2004/0053648 A1 | 3/2004 | Gremo et al. |
| 2004/0104826 A1 | 6/2004 | Philipp |
| 2005/0030724 A1 | 2/2005 | Ryhanen et al. |
| 2005/0257628 A1 | 11/2005 | Nikaido et al. |
| 2006/0032664 A1 | 2/2006 | Ohtake |
| 2006/0243462 A1 | 11/2006 | Schilling et al. |
| 2007/0031161 A1 | 2/2007 | Iandoli et al. |
| 2007/0069418 A1 | 3/2007 | Liao et al. |

FOREIGN PATENT DOCUMENTS

| | | |
|---|---|---|
| GB | 2027209 A | 2/1980 |
| JP | 2006344163 A | 12/2006 |
| WO | 9534423 A1 | 12/1995 |
| WO | 0224431 A1 | 3/2002 |
| WO | 2006048627 A1 | 5/2006 |
| WO | 2007038536 A2 | 4/2007 |

OTHER PUBLICATIONS

Supplementary European Search Report, EP 08873908, dated Dec. 14, 2011.

Japanese Office Action for Application No. 2011-504993 dated Jan. 25, 2013.

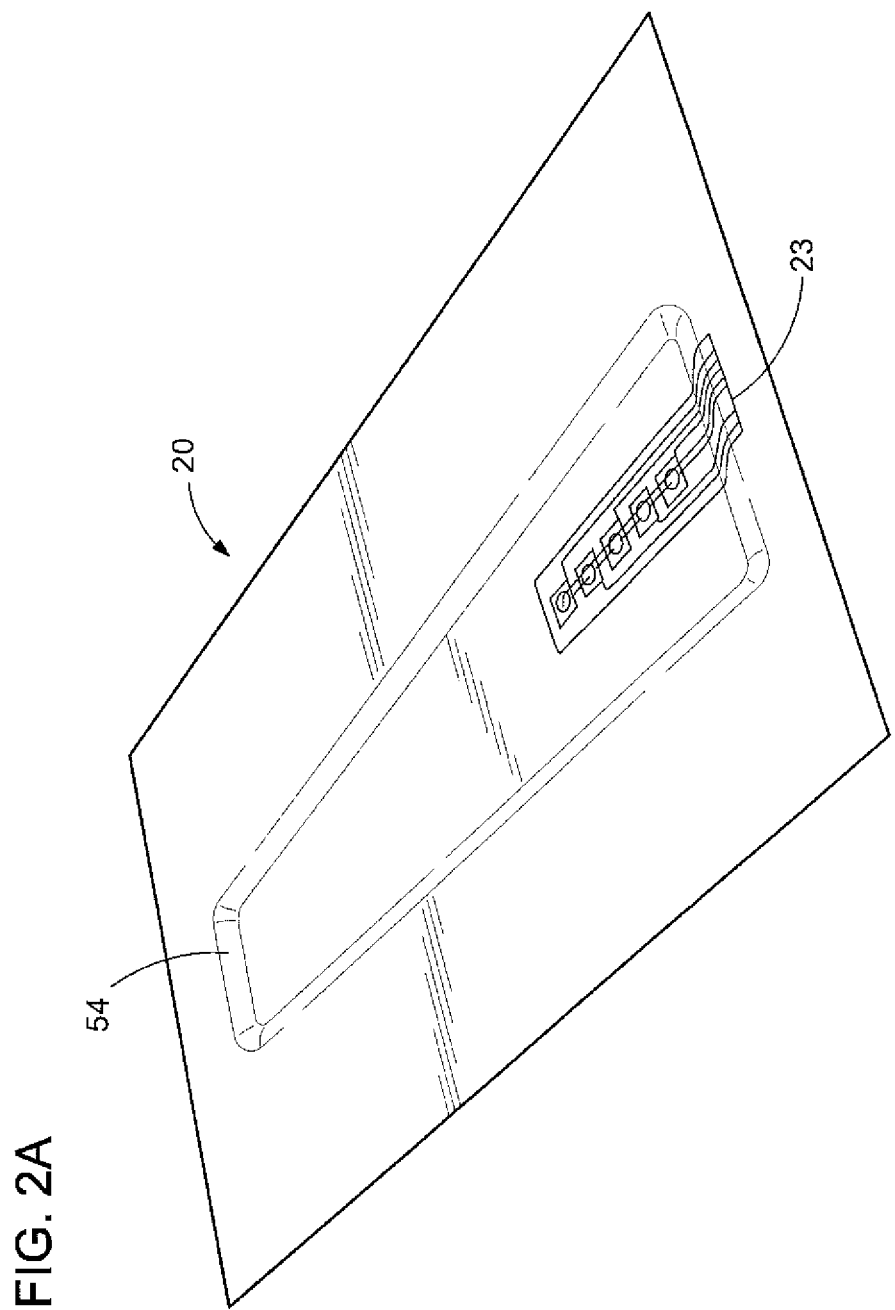

IN-MOLDED RESISTIVE AND SHIELDING ELEMENTS

CROSS REFERENCE TO RELATED APPLICATIONS

The present application is a continuation of U.S. patent application Ser. No. 12/191,825, filed Aug. 14, 2008, which is a continuation-in-part of U.S. patent application Ser. No. 12/106,250, filed Apr. 18, 2008, which claims priority to, and the benefit of U.S. Provisional Patent Application Ser. No. 60/925,421, filed Apr. 20, 2007, all of which are hereby incorporated by reference in their entirety.

FIELD OF THE INVENTION

The present disclosure relates to touch sensitive switches, and more particularly, to capacitive switches that are molded in a plastic structure. The present disclosure further relates to in-molded resistive and shielding elements.

BACKGROUND

Touch sensitive switches are used in applications such as home appliances (e.g., touch panels on stoves, washers and dryers, blenders, toasters, etc.), and portable devices (e.g., IPOD, telephones). Typical touch sensitive switches utilize resistive film sensing or capacitive sensing. Resistive film sensing utilizes two conductive resistive plates that are separated by a very thin spacer. When a light force is applied to one of the plates contact is made with the other plate and the resistance of the system increases. This in turn increases the voltage and can be used to provide an output. This type of technology can be used for single outputs as well as slider switch type outputs. The drawback to this type of switch is that it relies on the elastic properties of the film (and spacer, adhesives, etc.) to return to a known state when the force is removed.

Capacitive switching detects changes in capacitance due to a switching event, such as the placement of an object or a finger proximate to or in contact with the switch. Capacitive switches differ from the resistive approach above because they require substantially no force to realize switch activation. The actual sensitivity of this type of switch can be tuned via a detection circuit. Capacitive switches beneficially provide immunity to interference and eliminate the need for electro-mechanical switch gear (e.g., pushbuttons or sliding switches). In addition, because there are no moving parts, the failure rate is low. However, known techniques for manufacturing capacitive switches are not well-suited to integrating the switches into three-dimensional support structures (e.g., user interfaces such as control panels). In addition, known capacitive switches cannot be readily integrated into structures having contoured shapes without the use of difficult assembly and alignment processes. Thus, a need has arisen for a capacitive switch that addresses the foregoing. A similar need has arisen for in-molded resistive and shielding elements.

SUMMARY

An article of manufacture having an in-molded capacitive switch comprises a film and a plastic support structure. The film has a front surface and a back surface and at least one conductive ink sensing zone printed on the back surface. The film is secured to the plastic support structure such that the back surface of the film faces the plastic support structure. In one embodiment, at least a portion of the front surface of the film is exposed. In another embodiment, at least one conductive ink sensing zone is not exposed. In a further embodiment, indicia relating to the function of the capacitive switch is printed on the back surface of the film and is visible on the front surface of the film.

A method of making an article of manufacture having an in-molded capacitive switch comprises providing a film having a front surface and a back surface, applying a conductive ink sensing zone on the back surface, and forming the film into a desired shape. The film is preferably disposed in an injection mold having an interior such that the conductive ink sensing zone faces into the interior of the mold. Molten plastic is flowed into the injection mold to create a plastic support structure attached to the film, thereby creating the article. In one embodiment, the conductive ink sensing zone does not contact any of the surfaces of the mold. In another embodiment, at least one connector is molded into the article of manufacture such that it is electrically connected to the at least one conductive sensing element. In another embodiment, the step of forming the film into a desired shape comprises vacuum thermoforming. In a further embodiment, the step of forming the film into a desired shape comprises high pressure forming.

An article of manufacture is provided that has an in-molded resistive and/or shielding element. A film has a front surface and a back surface and at least one resistive and/or shielding element is printed on the front or back surface. The film is secured to a plastic support structure such that the front or back surface of the film faces the front surface or back surface of the plastic support structure. In one embodiment, at least a portion of the front or back surface of the film is exposed. In another embodiment, at least one resistive or shielding element is not exposed. In a further embodiment, indicia relating to the function of the article of manufacture is printed on one surface of the film and is visible on the other surface of the film.

A method of making an article of manufacture having an in-molded resistive and/or shielding element is also provided. This method includes the steps of providing a film having a front surface and a back surface, applying a resistive or shielding element on the front or back surface, and forming the film into a desired shape. The film is inserted in an injection mold having an interior. Molten plastic is flowed into the injection mold to create a plastic support structure attached to the film, thereby creating the article.

The film can be inserted such that the resistive element or shielding element faces into the interior, away from the interior, or is in-between the top and bottom of the injection mold. This allows all, a portion, or none of the film to be exposed. In addition, the front or back surface of the film can be coated with a dielectric layer. Further, either the front surface or the back surface of the film can be disposed so as to face the front surface or back surface of the molded part.

In one embodiment, the resistive or shielding element does not contact any of the surfaces of the mold. In yet another embodiment, at least one connector is molded into the article of manufacture such that it is electrically connected to the at least one resistive or shielding element. In another embodiment, the step of forming the film into a desired shape comprises vacuum thermoforming. In a further embodiment, the step of forming the film into a desired shape comprises high pressure forming or hydroforming.

In one embodiment, applying the ink layer includes applying a conductive adhesive on the terminal block pin(s) by hand or robotic process and/or as a printed layer using a printer.

BRIEF DESCRIPTION OF THE DRAWINGS

The foregoing brief description, as well as further objects, features and advantages of the present invention will be understood more completely from the following detailed description of presently preferred embodiments, with reference being had to the accompanying drawings in which:

FIG. 2A depicts one embodiment the film of FIG. 1 following a forming operation;

DETAILED DESCRIPTION

Figure 1:
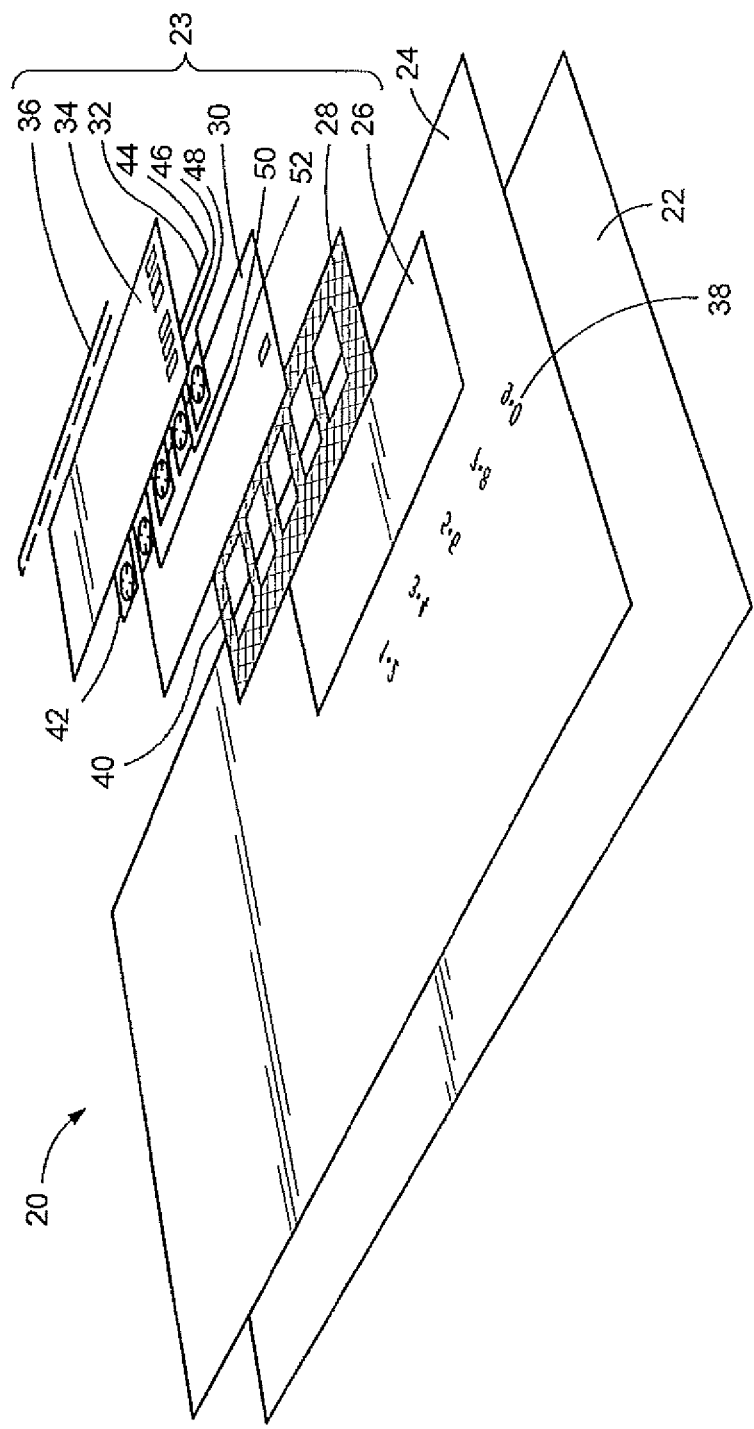
FIG. 1 is an exploded view of a film switch including a conductive ink sensing zone used to form an in-molded capacitive switch.

The present disclosure relates to in-molded switch devices. The preferred embodiment is directed to capacitive switches which may be in-molded. Moreover, the capacitive switches may also be in-molded as three dimensional structures. As mentioned above, capacitive switching detects changes in capacitance due to a disturbance that defines a switching event. The present disclosure further relates to in-molded resistive and shielding elements.

In one embodiment, when a conductive or charged object, such as a finger, is placed near a sensing zone, the sensing zone's capacitance changes, indicating the occurrence of a switching event. The sensing zone's capacitance changes are detected by sensing circuitry. The sensing circuitry can be tuned to detect specific changes in capacitance. For example, the sensing circuitry can be tuned to detect the presence of a finger proximal a sensing zone, while not detecting other types of disturbances (e.g., moisture). Examples of capacitive switch sensing electronics are disclosed in, for example, U.S. Pat. No. 5,972,623 to Gupta et al., filed Oct. 21, 1997, entitled "Solid state capacitive switch," the entire contents of which are incorporated by reference herein. Moreover, as discussed herein, the capacitive switches may be used to detect an object at a distance as well as a touch. These sensing operations are described in detail with respect to U.S. Pat. Nos. 5,730,165, 6,288,707, 6,377,009, 6,452,514, 6,457,355, 6,466,036, 6,535,200, the entire contents of which are incorporated by reference herein.

To integrate capacitive switches into three-dimensional support structures, it is desirable to provide a switch that can be contoured to a desired shape while still retaining its ability to detect capacitance changes. It has been found that by printing capacitive switch elements on a film and molding the film with a plastic material, the switch can be advantageously contoured to a desired shape. Such in-molded capacitive switches have numerous applications. For example, the switches can be used in numerous automotive interior applications such as center stack consoles (e.g., radio switches, HVAC switches, navigation switches, heated seat switches, etc.). Moreover, the switches can be molded to appear flat (like a touch panel,) indented (to direct the user to the switch), or to look like a rotary knob (protruding outward from the surface).

In addition, the in-molded capacitive switches described herein can be used in overhead consoles (e.g., sunroof, map light, homelike switches), door trim (e.g., window and heated seat switches). Depending on the application, it may be preferable to take steps to ensure that the switch can not accidentally be activated by touch alone. Other applications include exterior lighting switches on a vehicle instrument panel, A-pillar trim switches for operating power liftgates and liftglass, B-pillar switches for keyless entry appliques and interior illumination (once the keyless entry is activated). Other applications may include switches to control accessories (such as an IPOD®) that may be included, for example, in the center console as a flip out module.

In addition to forming in-molded capacitive switches, the methods described herein can be used to form other types of contoured and rigid connector structures. For example, typical door latches contain several switch functions (i.e. door ajar, door open, child security, O/S lock/unlock, I/S lock). Typically these connections are made with metal stampings, which lend themselves well to the application. However, with several switches and varying latch cover plastic thicknesses, it can become rather difficult to route these connections. The interconnection system used in these applications could be replaced with printed conductive ink conductors. The use of conductive ink traces makes it simpler to route the conductors in areas where it was not possible before.

The present disclosure is not limited to automotive applications. For example, the switches described herein may be used with appliances with touch type switch panels (i.e. microwaves, stoves, refrigerators, washers, dryers, blenders, tasters). Other examples may include consumer electronics such as music players or laptop computers where the switches may be in-molded with the plastic housings of such devices. The in-molded switch concept lends itself especially well to these applications given the trend to providing more rounded edges and three dimensional shapes. In addition, these switches will not wear out over time like a membrane or dome type switch array.

In a preferred embodiment, a three-dimensional molded part is created which includes one or more of the following features:
1. Complex shape;
2. In-molded graphics for items such as switches;
3. In-molded decorative surfaces (i.e. wood grain, chrome, paint colors);
4. In-molded conductive circuit traces and switches (electrodes); and
5. Termination and attachment methods from the in-molded conductive inks to outer mating connection points.

As will be apparent, such three-dimensional shapes can have several surfaces, where the surfaces are either flat, curved or a combination of both.

A method of making an in-molded capacitive switch will now be described. Generally, the method comprises preparing a film switch by printing a conductive ink sensing zone on a formable film, forming the film to a desired shape, die-cutting the formed film, inserting the formed film in an injection mold, and introducing a molten plastic material into the mold. Referring to FIG. 1, an exploded view of a film comprising a film switch 20 is described. In the embodiment of FIG. 1, film switch 20 comprises a film 22 on which a variety of ink layers are printed. The embodiment of FIG. 1 is directed to a keyless vehicle entry system. Film 22 comprises a sheet of formable film. Exemplary films that are suitable for use as film 22 include polycarbonate-based Makrofol® and Bayfol® films supplied by Bayer Films Americas of Berlin, Conn. The color, translucence, and/or transparency of film 22 may be selected based on the desired application. However, in the embodiment of FIG. 1, film 22 is a smoked black color that is preferably translucent and which allows graphic indicia printed on one side to be viewed on the other side.

As shown in FIG. 1, several layers of various inks 24, 26, 28, 30, 32, 34, and 36 are printed on film 22 to give the part its decorative appearance, to provide the graphics for the keyless functions, and to provide the conductive switches (electrodes) for activation by a user. A wide variety of printing processes may be used to deposit the various ink layers, including without limitation screen printing, off-set printing, gravure printing, flexographic printing, pad printing, intaglio printing, letter press printing, ink jet printing, and bubble jet printing. However, in the exemplary embodiment of FIG. 1, screen printing is preferred.

Referring again to FIG. 1, ink layer 24 is applied to film 22 using a printing process as described above. Ink layer 24 preferably includes inkless areas that define graphic indicia related to the desired switching function. Since the embodiment of FIG. 1 is directed to keyless entry systems, the inkless areas 38 preferably define alpha-numeric characters. Next, a layer of white translucent ink 26 is printed on top of inkless area 38 to give the graphic indicia a white appearance. Of course, other colors may be used if desired. Suitable inks for forming ink layers 24 and 26 include without limitation Noriphan® HTR, a solvent-based, one-component screen printing ink based on a high temperature resistant thermoplastic resin which is supplied by Proll KG of Germany, and Nazdar® 9600 Series inks with 3% catalyst, which are supplied by the Nazdar Company of Shawnee, Kans.

Next, a conductive ink ground layer 28 is printed on white ink layer 26. Ground layer 28 provides a barrier for the switch (electrode) traces to ensure that inadvertent actuations do not occur by accidentally touching a trace. The conductive ink used in ground layer 28 and the other conductive ink layers (described below) is preferably formulated to withstand forming processes wherein film 22 is formed into a desired shape. The conductive ink is also preferably formulated to withstand typical injection molding temperatures and blow-off. One suitable conductive ink is DuPont Silver Conductor 5096, which is designed for use in thermoforming operations or where extreme crease conditions are employed on flexible substrates. Another example of a conductive ink is Electrodag® SP-405 available from Acheson. Colloids Company. Ground or shield layer 28 includes a plurality of unprinted (inkless) areas 40 that define apertures which are sized to accommodate conductive ink sensing zones 42 (discussed below).

Dielectric layer 30 is printed on ground layer 28 using a dielectric ink that is formulated to withstand the film forming and molding processes described below. Dielectric layer 30 is preferably configured to cover the entire ground layer 28 and insulates conductive ink sensing zones 42 and their associated electrodes from ground layer 28.

Switch layer 32 is then printed on dielectric layer 30. Switch layer 32 is formed from a conductive ink of the type described above with respect to ground layer 28. Switch layer 32 also comprises a plurality of sensing zones 42 which sense the presence of an object, finger, etc. at different locations. As shown in the figure, sensing zones 42 are preferably aligned in correspondence with one of the indicia 38 so that a user's selection of a particular one of the indicia is detected by a corresponding one of the sensing zones 42. Switch layer 32 also comprises a plurality of electrode traces 44, 46, 48, 50, and 52 which allow each sensing zone 42 to be connected to a sensing circuit (not shown).

If desired, film switch 20 may include one or more LEDs to illuminate regions of film switch 20. In the embodiment of FIG. 1, LEDs (not shown) are provided to backlight each of the sensing zones 42 and graphic indicia 38. For a keyless entry application, LEDs are especially helpful to allow the car owner to see the indicia 38 at night. LEDs may also be activated in response the presence of a finger or object near film switch 20 so that as a person begins to execute keystrokes necessary to unlock the doors, graphic indicia 38 will become illuminated. The LEDs may have their own dedicated sensing zone, or they may be activated in response to a switching event at one or more of the sensing zones 42. If LEDs are used, dielectric layer 34 is preferably printed on switch layer 32 using a dielectric ink to electrically isolate the LED circuit from the switch circuit (i.e., sensing zones 42 and electrodes 44, 46, 48, 50, and 52).

To facilitate the foregoing printing processes, the film 22 preferably remains substantially flat during the printing of ink layers 23 and 24. It should be noted that there can be multiple layering sequences other than those noted above to create the capacitive switch. For example, if LED's are not desired, then the conductive layer may be removed from the print layers stack-up. Alternatively, layers may be eliminated by combining layers such as the electrode and LED layers. However, after film switch 20 is prepared, it is preferably formed to a desired shape and size. The desired shape is preferably selected based on the structure into which it will be incorporated. Thus, for example, if the film switch 20 is to be used on a vehicle A-pillar, it is preferably formed to have shape that conforms to the A-pillar shape.

Any suitable forming process which provides the desired shape without compromising the integrity or performance of the ink layers can be used to shape film switch 20. However, in a preferred embodiment, switch 20 is shaped by thermoforming (vacuum) or pressure forming such as Niebling HPF (high pressure forming) or hydroforming. For applications in which tightly registered (aligned) graphics are required, pressure forming is preferred. However, in those applications where registered graphics are not required, vacuum thermoforming may be suitable.

In a vacuum thermoforming process, a mold is provided that defines the desired film shape. The mold may comprise cavities and/or raised portions to define recessed surfaces and protruding surfaces, respectively, in the film. The film is then clamped in a frame and heated. Once a rubbery state is achieved (e.g., flexible, softened, supple, and the like), the film is placed over the mold cavity. Air is then removed from the cavity via a vacuum, such that atmospheric pressure forces the film against the walls of the mold. Typical vacuum thermoforming temperatures are generally from about 180° C. to about 200° C. with a temperature of about 190° C. being preferred. Typical vacuum thermoforming pressures are about 1 Bar.

In the Niebling HPF process, high pressure air is used to force the film into the mold, and a vacuum is not required. Details of exemplary high pressure forming processes are provided in U.S. Pat. No. 5,108,530, the entire contents of which are hereby incorporated by reference. In the Niebling HPF process, typical temperatures are from about 160° C. to about 180° C. The process pressure is generally from about 100 Bar to about 300 Bar.

Pressure forming processes using pressures lower than those in the Niebling process may also be used to form film 22 to the desired shape (such as the Hytech Accuform process). In one exemplary embodiment, film 22 comprises a polycarbonate sheet. When polycarbonate sheets are used, typical forming parameters include a pressure of about 35 Bar, a temperature of about 160 to 180° C., a maximum draw depth of about 35-40 mm, and an elongation ratio of about 3:1 to about 4:1.

The form tool is preferably designed to create a part where decorative features are visible on the A-surface of film 22. In a preferred embodiment, the decorative features are printed on the B-surface of film 22 and are visible on the A-surface. However, in other embodiments, the decorative features may be printed on the A-surface of film 22. Generally, it is preferable to use a positive (i.e., male or protruding) tool as opposed to a negative (i.e., female or cavity) tool in the film forming process to avoid contact between the film's A-surface and the tool surface, which can produce marks and surface wear on film 22. It should be understood however, that a negative tool can be used in the forming process instead. The cycle times, temperatures, and vacuum or pressures are preferably adjusted accordingly to ensure the part does not exhibit any cracking of inks or excessive stretching.

In a hydroforming process a diaphragm face of unpressurized fluid comes into contact with the film surface. The diaphragm is contained within a frame that is matched to an embossing die (male tool). At the appropriate time the fluid is pressurized, which forms the film into the desired shape based on the male tool on the other side of the film. The diaphragm again is depressurized and the film can be released from the tool. The cycle times, temperatures, and pressures are preferably adjusted accordingly to ensure the part does not exhibit any cracking of inks or excessive stretching.

An embodiment of a film switch 20 after the forming operation is depicted in FIG. 2A. As FIG. 2A indicates, film switch 20 includes a contoured region 54 that is produced by the forming operation. FIG. 2A is a view of the "B-surface" of film switch 20, i.e., the surface that faces away from a user when film switch 20 is molded in a support structure. As shown in FIG. 2A, ink layers 23 are also contoured. After forming, film switch 20 is then cut to the desired shape. In an exemplary process, die cutting is used (e.g., using a column guided punching tool with a male and female die set).

Figure 2B:
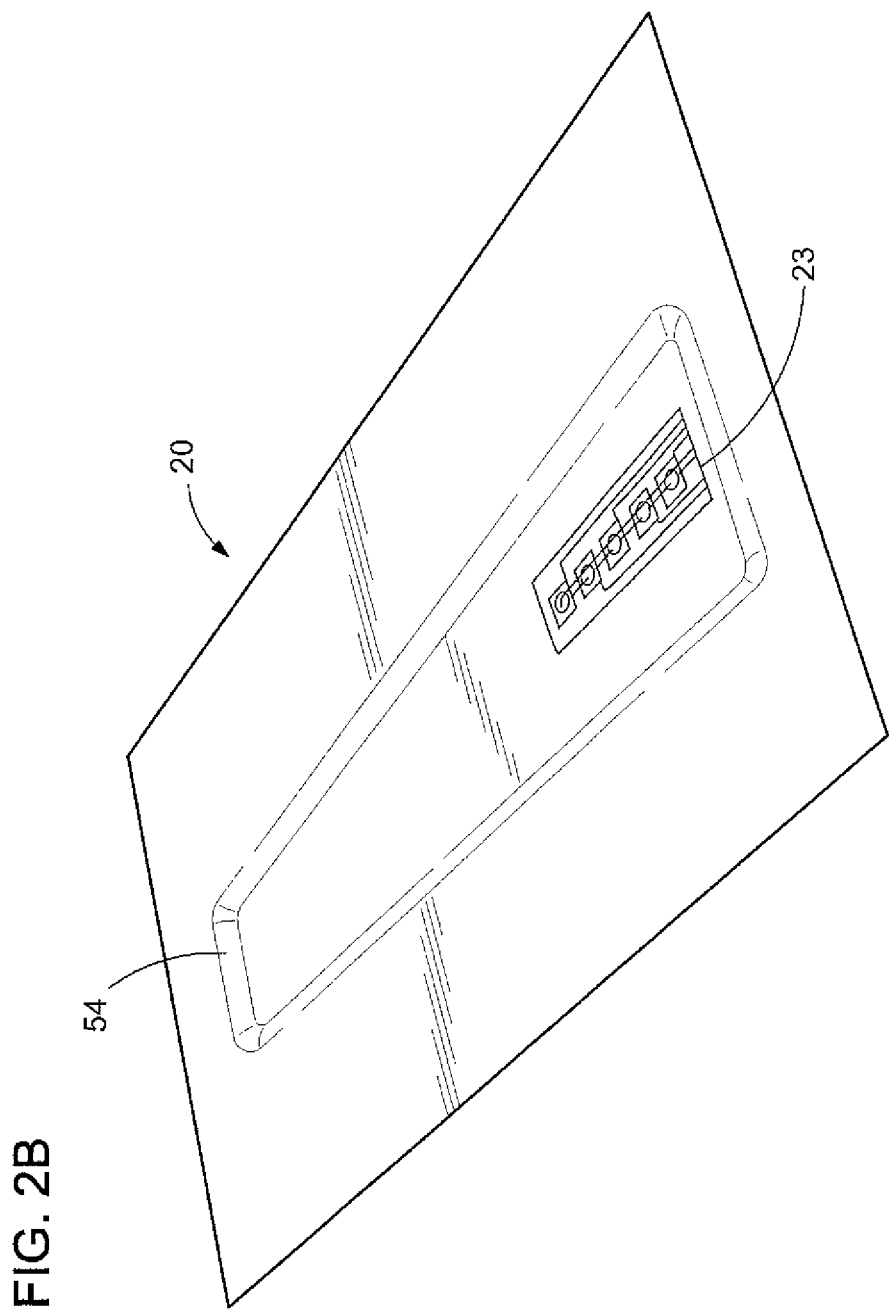
FIG. 2B depicts one embodiment the film of FIG. 1 following a forming operation.

FIG. 2B illustrates another embodiment of a film switch 20 including a contoured region 54 after the forming operation. Instead of showing the printed layers flowing up and over the edge of the formed part, as depicted in FIG. 2A, for the method of inserting the connector into the molded part (described in more detail below with respect to a switch tail configuration) the conducive layers of ink layers 23 are not printed up over the formed edge to be die cut.

Following the forming of film switch 20, a three-dimensional, substantially rigid structure is formed which includes film switch 20 as a component. In a preferred embodiment, film switch 20 is a thermoplastic material which is molded with heat and pressure into a shape via an injection molding process. Typical molding parameters vary based on the resins being molded. However, some examples of molding parameters are provided. For urethanes (e.g., thermoplastic urethane or "TPU") typical injection molding pressures range from about 5,000 to about 8,000 PSI and the molding temperature ranges from about 380 to about 410° F. For polycarbonates, typical injection molding pressures range from about 8,000 to about 15,000 PSI and the molding temperature ranges from about 540 to about 580° F. Of course, each material may have preferred molding pressures or temperatures outside of the exemplary ranges provided.

A wide variety of thermoplastic materials may be used, including but not limited to polycarbonates, acrylonitrile-butadiene-styrene ("ABS") polymers, and polycarbonate blends such as polycarbonate-ABS, polycarbonate-polybutylene terephthalate, and polycarbonate-polyethylene terephthalate. Specific examples of the foregoing polycarbonate blends are those sold under the Makrolon® name by Bayer Films Americas. In certain embodiments, the thermoplastic resin preferably has a melt flow index of greater than about 20 as measured by the ISO 1133 or ASTM D-1238 procedures. In one exemplary embodiment, film 22 comprises a polycarbonate film and the thermoplastic comprises Makrolon® 2405, which has an ASTM D-1238 melt flow index (300° C./1.2 kg) of 20. Exemplary thermoplastic urethanes include Texin® thermoplastic urethanes supplied by Bayer MaterialScience LLC of Pittsburgh, Pa. One exemplary Texin® material is Texin® 245. Exemplary ABS materials include ABS materials supplied by Lanxess Deutschland GmbH. Two exemplary ABS materials supplied by Lanxess are Lustrant® LGA and Lustran® LGA-SF. In addition, acrylic materials such as Plexiglas® V052 a product of Altuglas International of Philadelphia, Pa. may be used. In certain embodiments, such as those using polycarbonates or thermoplastic urethanes, the thermoplastic material bonds well directly with the film. However, in other embodiments, an adhesion promoter may be required for improved bonding with the film.

To form the desired part, a mold (not shown) is provided which is configured to accept and retain film switch 20. The mold preferably comprises two halves (shells) that can be mated to define a mold cavity in which molten thermoplastic is injected. The mold cavity defines the shape of the part being formed. One of the mold halves is stationary and one is movable. Film switch 20 is preferably disposed in the stationary mold half and held in place by a press fit as the mold halves are mated prior to introducing the molten plastic.

In addition, the stationary mold half is preferably configured to retain film switch 20 such that the thermoplastic material can flow over it to yield part in which some or all of the A-surface (user-facing surface) of film switch 20 exposed. In certain embodiments, the graphics, sensing zones, and electrodes are less than 0.5 mm behind the exposed A-surface of film switch 20. Film switch 20 is preferably disposed in the mold such that printed ink layers 23 and 24 (FIG. 1) face into the mold interior without contacting the mold surfaces. This process advantageously produces a finished support structure that allows the user to directly contact film switch 20, while still protecting the ink layers 23 and 24 from direct exposure to the environment. As a result, the A-surface of the finished part will appear to contain all the decorative features such as switch graphics, simulated wood grain, chrome or other smooth or textured surfaces. However, these graphics will actually be on the B-surface of the film, with the switch circuit printed directly behind the graphic indicia portions. While it is preferable to locate the ink components on the B-surface of film switch 20, in certain embodiments the ink components may be located on the A-surface to face the user in an installed condition.

In an embodiment, connector terminals are provided to allow the in-molded capacitive switch to be removably connected to sensing electronics or other electronic devices. The terminals are preferably designed to match the contoured, three dimensional shape of the B-surface of film switch 20. Each terminal is placed in the "moving side" of the injection mold. The terminal ends press fit into receiver pockets in the mold. This step may be completed as a hand or robotic process. Location may be established by a pocket in the moving mold half and a locator pin (this can also be an ejector pin). A pressure zone (adhered to the terminal in advance) is another option for keeping the terminal in place.

A thin film (bead) of any type of conductive adhesive (i.e. silver filled epoxy) is applied to the surface of each terminal connector such that it touches the conducive ink traces 44, 46, 48, 50, 52 (FIG. 1) on the film switch 20 once the mold halves are mated. The application of the conductive adhesive may be completed by hand or robotically automated. An example of conductive adhesive is CHO-BOND® 584 (available from Chomerics) which combines the adhesive properties of epoxy with the conductivity of silver. Another method for insuring terminal attachment (i.e., connection) is using a B-stageable conductive epoxy that is printed over the conductive traces in the printing process.

After applying the conductive adhesive to the connector terminals, the injection mold is closed and the normal injection molding sequence ensues to cause the selected thermoplastic material to flow into the mold cavity defined by the two mold halves. In this step the terminals and conductive epoxy are pressed onto the silver ink traces 44, 46, 48, 50, and 52 on film switch 20. Careful steps should be taken to ensure that the injection molding process does not force the conductive epoxy to inadvertently flow into unwanted areas. The heat of the injection molding process actually cures the conductive epoxy in a short time frame (at room temperature this process could take up to 24 hours). The part is then ejected from the mold. As a result of this process, the thermoplastic material holds the terminals in place. Thus, connector can be molded directly into the plastic part.

In addition to providing terminals that are individually molded into the part, a terminal block may also be provided. In this embodiment, multiple terminals are pre-molded into a terminal block, and the block is then molded into the part. In certain variations, the terminal block will have a substantially flat surface that is connected to conductive ink traces 44, 46, 48, 50, and 52. However, a terminal block may also be provided wherein individual terminals protrude from the block to connect to the conductive ink traces. An exemplary terminal block that is suitable for this embodiment is a BergStik® Unshrouded Header 54201 connector supplied by FCI of Etters, Pa. The same methods of attaching a terminal block as previously described apply here (e.g., using conductive epoxy).

It should be noted that there are several advantages to the type of conductor arrangement described above. In certain embodiments, there is no piercing of the decorative film layer 22, thereby eliminating the need for a wraparound film switch tail (however this is a viable termination method, as described below). In other embodiments, terminal connectors can be permanently fixed in place via an injection molding process, minimizing the possibility of their becoming unattached from the silver ink through the conductive adhesive. The previously described molding process minimizes the likelihood of the conductive epoxy cracking, which could degrade its performance. Further, the conductive adhesive is cured quickly due to the heat transfer of the injection molding process. Normally, conductive adhesives such as epoxies are cured at room temperature or through infrared or ultrasonic curing methods. However, they quickly cure at common injection molding temperatures, such as those described previously.

Alternatively, instead of using molded in connectors or connector blocks, a flat flexible cable (e.g., a wraparound film switch tail or "pig-tail") may also be used to connect switch layer 32 to sensing circuitry or other electronic components. One exemplary flat flexible cable connector is an FCI 65801 Clincher Receptacle. In this embodiment, the wrap-around switch tail is connected to conductive traces 44, 46, 48, 50, and 52 and is molded into the part so that a free end of the tail extends from the part for connection to the sensing circuitry or other electronic components. This embodiment is depicted in FIG. 2B. Particularly, FIG. 2B illustrates the conducive layers of ink layers 23 inserted into the molded part as opposed to printed over the formed edge.

Figure 4:
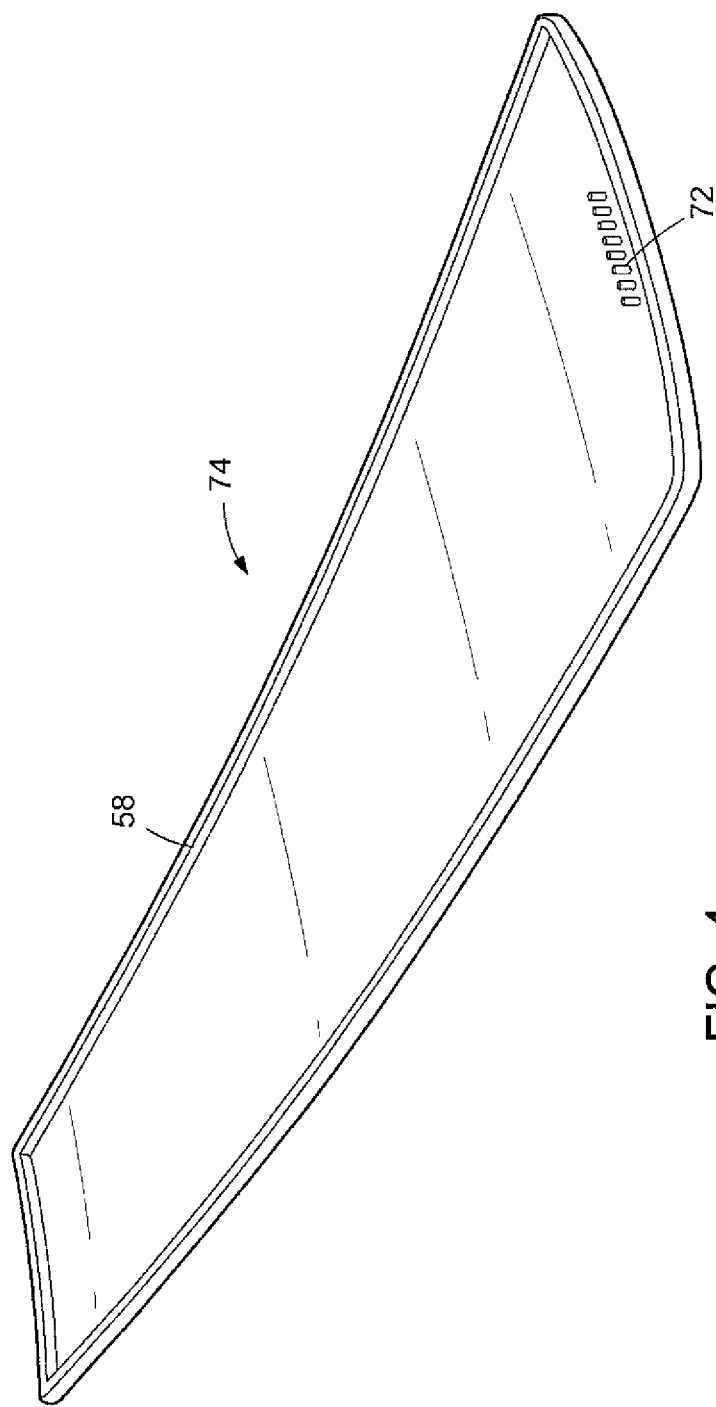
FIG. 4 is a perspective view of an article of manufacture having an in-molded capacitive switch used to depict the attachment of connector terminals.

FIG. 4 depicts a cross-sectional view of a molded part 56 including a capacitive switch. As the figure indicates, connector terminal 60 is attached to one of the conductive ink traces 44, 46, 48, 50, 52 (FIG. 1) via a conductive adhesive 61. Molded plastic 58 surrounds a portion of connector terminal 60, thereby securely retaining it in molded part 56. It should be noted that although it is not shown, a female connector housing may be incorporated into the molded part to avoid the use of terminals that protrude from the part. In this embodiment, a mating connector is removably attached to the molded part after the molding process is complete. The use of a female connector housing also protects the terminals from being damaged during manufacturing operations prior to attachment to the mating connector. In certain embodiments, the mating connector is an individual component, while in other embodiments it is incorporated into an electronic module that includes the sensing circuitry for detecting switching events.

In another embodiment, instead of molding terminals 60 in molded plastic 58, the part may be molded with voids that allow for subsequent attachment to connector terminals after the molding process. In this embodiment, a close-out is provided in the injection mold to define voids in the part. The voids are preferably in substantial alignment with conductive ink traces 44, 46, 48, 50, and 52. The connector terminals are inserted into the voids and in contact with the conductive ink traces 44, 46, 48, 50, and 52. Any space around the connector terminals is then filled with a suitable plastic material to seal conductive ink traces 44, 46, 48, 50, and 52. A conductive adhesive of the type described previously may also be used to connect the terminals to the conductive ink traces 44, 46, 48, 50, and 52.

It is envisioned that the electronics associated with the capacitive switching would be directly connected to terminals 60 to provide for a low profile packaging concept. FIG. 4 shows molded part 56 from the backside (B-surface) to show how the terminals 60 are positioned. Of course, terminals 60 may be located anywhere on the back of the part based on the application.

In contrast to many known processes, the foregoing process avoids the need for providing separate graphic overlays to protect sensing zones 42 and associated electrodes 44, 46, 48, 50, and 52. Because the film switch 20 is formed to a shape that corresponds to the desired support structure shape, the electrodes and sensing zones can be more consistently positioned at equal distances from the front surface of the article, thereby reducing variations in sensitivity amongst the individual sensing zones and electrodes. When over-molding, all of the switch elements including the electrodes and conductors are protected from environmental concerns (i.e. humidity, salt exposure). Insert molding the connector terminals 60 and sealing off directly around them minimizes these environmental issues.

If desired, LED's may be directly mounted on the conductive traces 44, 46, 48, 50, 52, and over-molded. However, it may be desired to provide a shut-off in the mold (leaving the conductive traces slightly exposed). In one embodiment, the LED would be attached using conductive epoxy or an equivalent method. The void in the mold could then be filled with thermally conductive epoxy to seal the LED. It may be also beneficial to mount the LED as a secondary process if the LED requires light piping to spread the light output to a wider output pattern. In this case the LED and light pipe (e.g., a light guide) assembly would be designed with leads that could be attached to the conductors. Another technique is to insert a light pipe that can assist in lighting multiple areas with one or more LED's. While this technique would require external connections to the LED's, it may prove cost beneficial.

Figure 3:
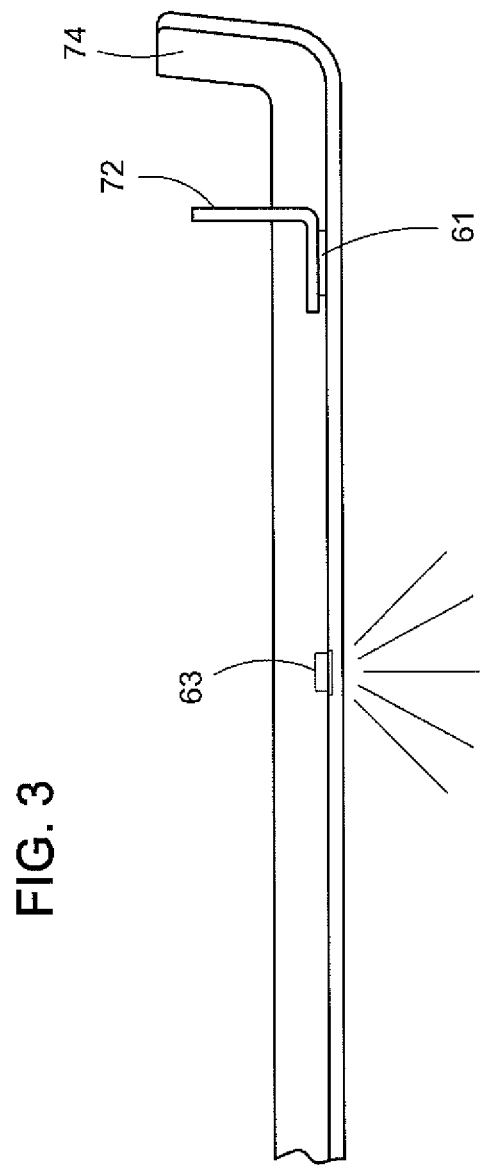
FIG. 3 depicts a cross-section of an article of manufacture having an in-molded capacitive switch.

An embodiment of an LED incorporated into a part with an in-molded capacitive switch is shown in FIG. 3, wherein LED 63 is molded into part 56. A typical LED that would be suitable is an Osram type "point LED" part number LW P473. Modification to the packaging of the LED may be required to ensure proper light output through the film and switch logos. These types of LED's typically draw 15 mA or less which allows for encasing them in plastic resin without overheating the component or the switch packaging. However, as mentioned previously, an alternative to totally sealing them is to leave a void in the backside of the molded part 56 where each LED is located to dissipate the heat. The void is made, for example, by including a core pin shut-off in the mold that mates with the B-surface of the film. This area could then be sealed with a thermally conductive epoxy which would prevent water intrusion. The process for the attachment to the conductors of such LED's would be similar to the terminal attachment described in this section. Parts such as the LED's may be, for example, hand inserted where pinpoint consistency of placement is not required. Alternatively, the LED's may be robotically inserted (such as using a pick and place machine) for precision or multiple component placement that would otherwise be too difficult or costly to perform using hand placement.

The in-molded capacitive switches described herein can be used in a number of different configurations and geometries. For example, conductors and electrodes can be formed into protruding or recessed shapes (for items such as knobs and buttons). The processes described herein allow the switch components to be printed onto a flat film and then formed to the desired shape. In addition, multi-segment sensing zones can be used.

Figure 5:
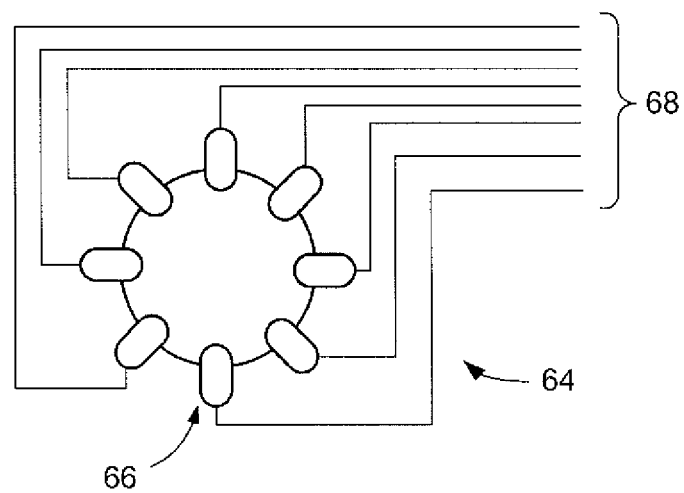
FIG. 5 is a plan view of a film switch that is molded into a knob structure.
Figure 6:
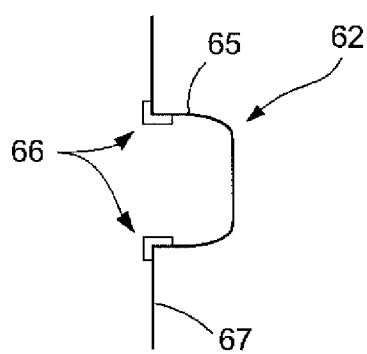
FIG. 6 is a cross-sectional view of a knob that incorporates the film switch of FIG. 5.

In one embodiment, a molded knob is created which allows a user to operate a device such an HVAC system, radio, CD player, etc. by moving his fingers around the circumference of the knob. An embodiment of a knob with an in-molded capacitive switch is depicted in FIGS. 5 and 6. Knob 62 is a generally cylindrical structure that is preferably molded from a plastic material and which includes a user contact surface 65 for triggering switching events. Film switch 64 generally comprises a series of printed ink layers on a film as described previously. FIG. 5 depicts a plan view of film switch 64 with sensing zones 66 and electrodes 68 (ground layers, dielectric layers and graphic layers are not shown), prior to a forming operation. Sensing zones 66 and electrodes 68 are printed using a conductive ink and printing process of the type described previously. Film switch 64 is preferably formed to the desired knob shape using a suitable forming process such as vacuum thermoforming. Like the previous embodiment, film switch 64 is preferably disposed in a stationary mold half such that the printed ink layers face into the mold cavity and avoid contact with the mold walls. The stationary mold half preferably defines a shape into which film switch 64 fits so that molten plastic may be injected over it. The ink layers that define sensing zones 66 and electrodes 68 preferably face into the mold cavity and do not contact the mold surfaces. Thus, as with the previous embodiment, the user exposed surface (A-surface) of the resulting structure comprises the A-surface of film switch 64. As shown in FIG. 6, in one embodiment, sensing zones 66 each define an L-shaped cross-section around the periphery of knob 62.

Knob 64 is preferably stationary. However, it allows the user to simulate rotation by triggering different switching events as the user's fingers traverse the knob's circumference, which causes capacitance changes at each successive sensing zone 66. As with the previous embodiments, connector terminals may be connected to electrode traces 68 via a conductive adhesive and molded into knob 64 to allow for removable connection to sensing circuitry or other electronics.

Figure 7:
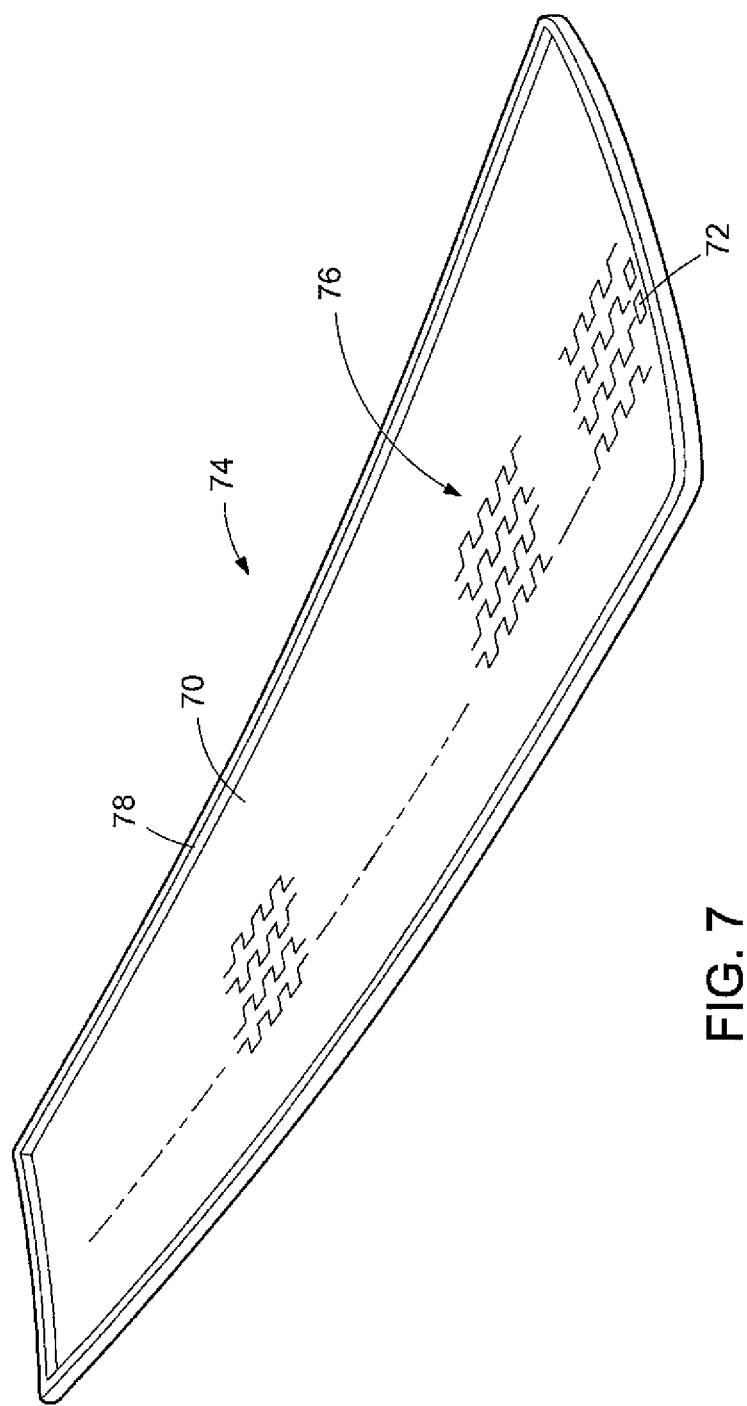
FIG. 7 illustrates a cross-sectional view of an in-molded resistive element including formed film layer including one or more conductive ink traces.

The resistive properties of the conductive ink can also be used to provide a voltage drop in circuits, to provide a heating device, or to provide an antenna. FIG. 7 illustrates a cross-sectional view of an in-molded resistive element part 74 including a formed film layer 70 on which one or more conductive ink traces 76 are printed. The formed film layer 70, in turn, is overlaid on molded plastic part 78 such that the formed film layer 70 has one side exposed, a portion of one side exposed, or both sides are in-between the top and bottom of the molded plastic part 78. Either side of the formed film layer 70 can face the interior of the molded plastic part 78. Conversely either side of the film layer 70 can be disposed to the exterior of the molded plastic part 78. In terms of the A and B-surfaces of the formed film layer 70 and the molded plastic part 78, the A-surface or B-surface of the formed film layer can be disposed on the A-surface or B-surface of the molded plastic part 78.

A connection point 72 (i.e., an exposed area of conductive ink) is provided on the surface of the film. Connection point 72 can then be used to connect the resistive element to another device, circuit or component. Connections to connection point 72 can be made by, for example, a spring-clip connector, rivet connector, and the like. In addition, a pig-tail type connector as discussed above can by used as an alternative. Alternatively, connection point 72 can be used to connect other conductive ink traces on the same printed and formed film layer 70 (not shown). These additional traces can be printed on a layer separated by, for example, a non-conductive layer such as a dielectric layer.

As discussed above, LEDs can be directly mounted on the conductive traces 76 and over-molded or surface-mounted using conductive epoxy, or an equivalent technique. Alternatively, the resistive element or trace design may serve as a heating component or as an antenna. In addition, the resistive elements may be part of a circuit also formed of conductive ink, such as an RC circuit, where both the resistor and capacitor of the RC circuit are formed at least in part of conductive ink. Film switch 20 described above with respect to FIG. 1 also can be printed on the same formed film layer 70. In addition, a dielectric layer can be constructed on either the front or back surface of the formed filled layer 70 to provide a coating over some or the entire surface. This dielectric coating can be used to protect an exposed surface or to provide a non-conductive layer between two ink layers.

The resistance of the conductive ink traces 76 is based on the ohms/square inch of the conductive ink, the thickness of the conductive ink traces 76 and the width and length of the conductive ink traces. The conductive ink traces 76 can thus be formed to provide different resistances. In one embodiment, the resistive elements can be used to provide a voltage drop to a device such as an LED.

The pattern of the resistive elements formed by conductive ink traces 76 also is a design choice. For example, conductive ink traces 76 may be arranged as a sine wave, a triangle, or zig-zag pattern. In addition, the layout of conductive ink traces 76 can be based upon the number of required connection points 72, or whether the resistive elements are to be connected serially or in parallel.

In another embodiment, the conductive ink traces 76 can be utilized to provide a tamper detection circuit, which detects a drop in voltage caused by a corresponding decrease in resistance of the in-molded resistive element 74 upon a break or puncture in film layer 70. Alternatively, a resistive element 74 can be designed to be tamper resistant, such that electrical connectivity is maintained if someone attempts to drill into or otherwise break or puncture the film layer 70.

As mentioned above, the conductive ink traces 76 can be used as heating elements. This configuration can be used to provide heat to, and thus control the temperature of, components affixed to or near the heating elements.

In yet another embodiment, an electromagnetic shielding element (or RF shield) is formed of conductive ink. Radiation of electromagnetic energy may be released from an electronic device. Some electronic devices generate sufficiently strong electromagnetic fields that propagate away from the device as to interfere with other electronic devices or otherwise cause problems. While radiated emissions are usually associated with non-intentional radiators, intentional radiators can also have unwanted emissions at frequencies outside their intended transmission frequency band. It is thus desirable to provide an electromagnetic shielding element to prevent radiation from exiting the device. Alternatively, it is desirable to provide an electromagnetic shielding element to prevent radiation from external sources from entering the device.

Ground or shield layer 28 of FIG. 1 may act as an electromagnetic shield. This property allows ground or shield layer 28 to inhibit the exit or entry of radiated emissions caused by electrical components within or outside of a device, respectively.

Figure 8:
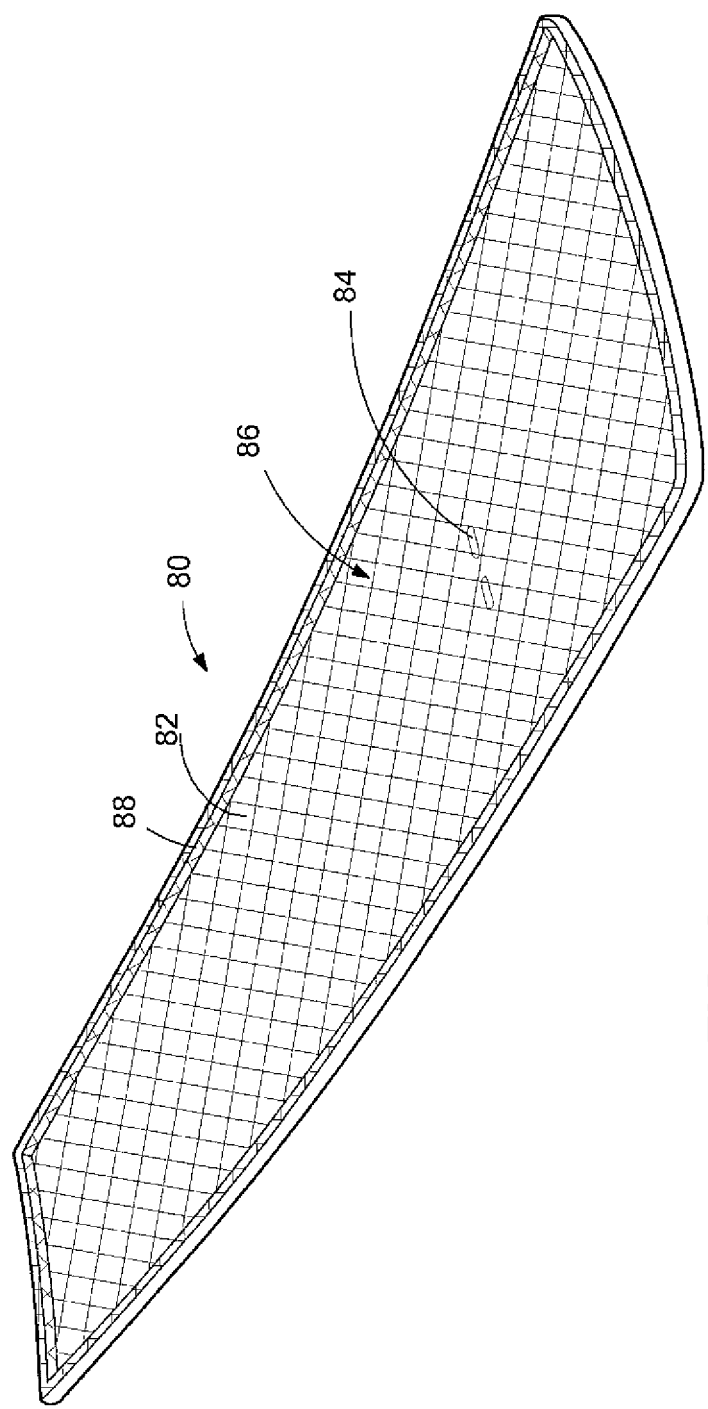
FIG. 8 depicts a cross-sectional view of an in-molded electromagnetic shielding element including a formed film layer.

FIG. 8 depicts a cross-sectional view of an in-molded electromagnetic shield part 80 including formed film layer 82 on which conductive ink traces 86 arranged in a grid pattern are printed. As described above, the conductive ink traces 86 provide a shielding layer to inhibit the exit or entry radiated emissions. The formed film layer 82 containing conductive ink traces 86 is shown completely covering a molded plastic part 88.

Either side of the film layer 82 can be disposed to the interior or exterior of the molded plastic part. Thus, in terms of the A and B-surfaces of the formed film layer 82 and the molded plastic part 88, the A-surface or B-surface of the formed film layer 82 can be disposed on the A-surface or B-surface of the molded plastic part 88.

In another embodiment, formed film layer 82 can be constructed to wrap around edges of molded plastic 88, as shown in FIG. 8. Alternatively, formed film layer 82 may form an electromagnetic shield partially covering molded plastic 88. The formed film layer 82 also can be exposed, partially exposed or in-between the top and bottom of the molded plastic part 88. In addition, a dielectric layer can be constructed on either the front or back surface of the formed film layer 82 to provide a coating over some or all of the surface. This dielectric coating can be used to protect an exposed surface or to provide a non-conductive layer between two ink layers.

The pattern of the shielding element formed by conductive ink traces 86 is a design choice. For example, the conductive ink traces 86 may be arranged in a grid pattern or as a solid sheet of ink. Additionally, conductive ink traces 86 can vary in thickness or in pattern throughout formed film layer 82, to selectively inhibit radiation from different electromagnetic fields or at different frequencies or frequency bands, thereby creating different shielding footprints.

As shown in FIG. 8 a connection point 84 (i.e., an exposed area of conductive ink) is provided on the surface of the film. Connection point 84 can be used to connect the shielding element to another device, circuit or component. Connections to connection point 84 can be made by, for example, a spring-clip connector, rivet connector, and the like. In addition, a pig-tail type connector as discussed above can by used as an alternative. Alternatively, connection point 84 can be used to connect other conductive ink traces on the same printed and formed film layer 82 (not shown). These additional traces can be printed on a layer separated by, for example, a non-conductive layer such as a dielectric layer.

Figure 9:
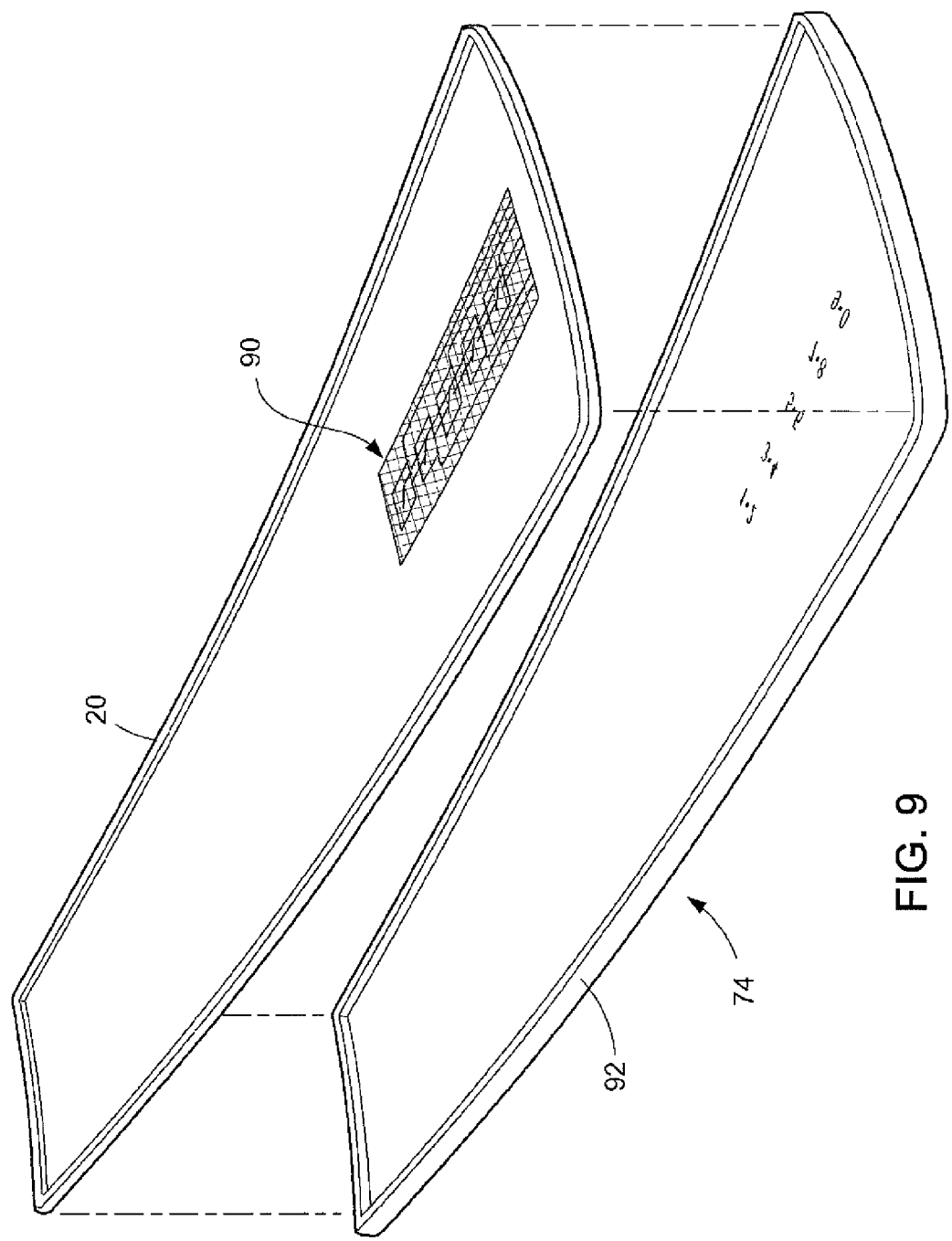
FIG. 9 illustrates an exploded view of an article of manufacture incorporating a film having a resistive element, an electromagnetic shielding element, and/or a film switch printed on the film.

FIG. 9 illustrates an exploded view of an article of manufacture 74 incorporating a film 20 having a resistive element and a film switch printed on a layer on the film 20 (shown collectively as ink layer 90). Film 20 can be inserted in a molded part 92 such that the printed ink layer faces into a mold cavity (or B-surface) and is not exposed after the molded part is formed. Alternatively, film 20 can be inserted in molded part 92 such that the printed ink layer faces the other way and is exposed.

In still another embodiment, either surface of film 20 can be disposed on the A-surface (i.e., exterior) of the molded part 92 as described above.

In yet another embodiment, film 20 can be inserted in-between the top and bottom of the molded part such that neither side is exposed or such that only a portion of the film is exposed. If necessary, the film can be inserted to avoid contact with the mold walls.

With reference also to FIGS. 7 and 8, in another embodiment, conductive ink traces that form an electromagnetic shielding element (FIG. 8, 86) can be substituted for the conductive ink traces that form the resistive element (FIG. 7, 76).

Resistive element, switch and/or electromagnetic shielding element also can be printed on the same layer. Or, they can be formed of different ink layers, separated by a non-conductive layer such as a dielectric layer.

Optionally, resistive element 74 (or electromagnetic shielding element 80) can be decorated with graphics, such as numbers, representative pictures, illustrations, and the like. Decoration of resistive element 74 or in-molded electromagnetic shielding element 80 may be accomplished utilizing various methods, including painting, laser etching, or other printing processes.

Alternatively, decoration of resistive element 74 or electromagnetic shielding element 80 may be accomplished by layering a decorated film layer on the front or back surface of resistive element 74 or electromagnetic shielding element 80. Backlighting can also be provided behind resistive element 74 or electromagnetic shielding element 80.

Figure 10:
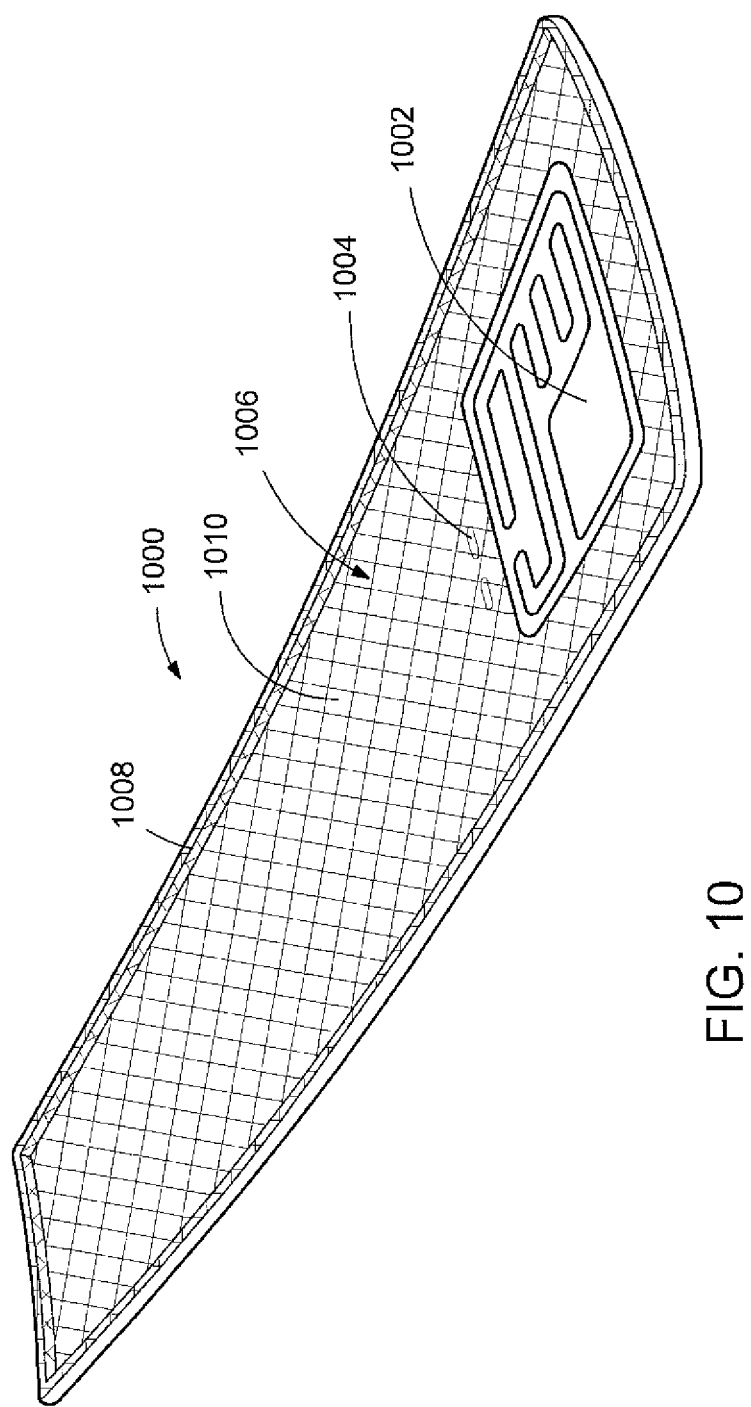
FIG. 10 illustrates an article of manufacture including a cellular antenna and an in-molded electromagnetic shielding element.

FIG. 10 depicts an article of manufacture which serves as a cellular antenna and shielding element 1000. In this embodiment, the design of conductive ink traces are printed on formed film layer 1010 to create a cellular antenna array 1002 and a shielding element 1000. Both the cellular antenna array 1002 and the shielding element 1000 can be constructed of the same ink layer or can be constructed of two separate ink layers separated by a non-conductive layer such a dielectric layer. The formed film layer 1010 of this embodiment is overlaid on molded plastic 1008. Film layer 1010 can be inserted in molded part 1008 such that the printed ink layer faces into a mold cavity (or B-surface) and is not exposed after the molded part is formed. Alternatively, film layer 1010 can be inserted in molded part 1008 such that the printed ink layer faces the other way and is exposed. In yet another embodiment, film layer 1010 can be inserted in-between the top and bottom of the molded part 1008 such that neither side is exposed or such that only a portion of the film is exposed.

Similarly, either the A-surface or the B-surface of film layer 1010 can be disposed on the outside (or A-surface) of the molded plastic 1008.

As shown, both the electromagnetic shielding layer 1006 and the cellular antenna array 1002 are exposed. Alternatively, electromagnetic shielding layer 1006 may completely or partially, or not at all cover cellular antenna array 1002 on one or more sides. Such a configuration can be accomplished by printing the cellular antenna array 1002 and the electromagnetic shielding layer 1006 on different ink layers and separating them by a non-conducted layer such as a dielectric layer. The above-described shielding embodiments can be configured to permit the cellular antenna array 1002 to radiate away from the device while protecting the circuits or persons on the other side of the array from that radiation.

As shown in FIG. 10 a connection point 1004 (i.e., an exposed area of conductive ink) is provided on the surface of the film. As described above, connection point 1004 can be used to connect the antenna and/or shielding element to another device, circuit or component. Connections to connection point 1004 can be made by, for example, a spring-clip connector, rivet connector, and the like. In addition, a pig-tail type connector as discussed above can by used as an alternative. Alternatively, connection point 1004 can be used to connect other conductive ink traces on the same printed and formed film layer 1010 (not shown). These additional traces can be printed on a layer separated by, for example, a non-conductive layer such as a dielectric layer.

Figure 11:
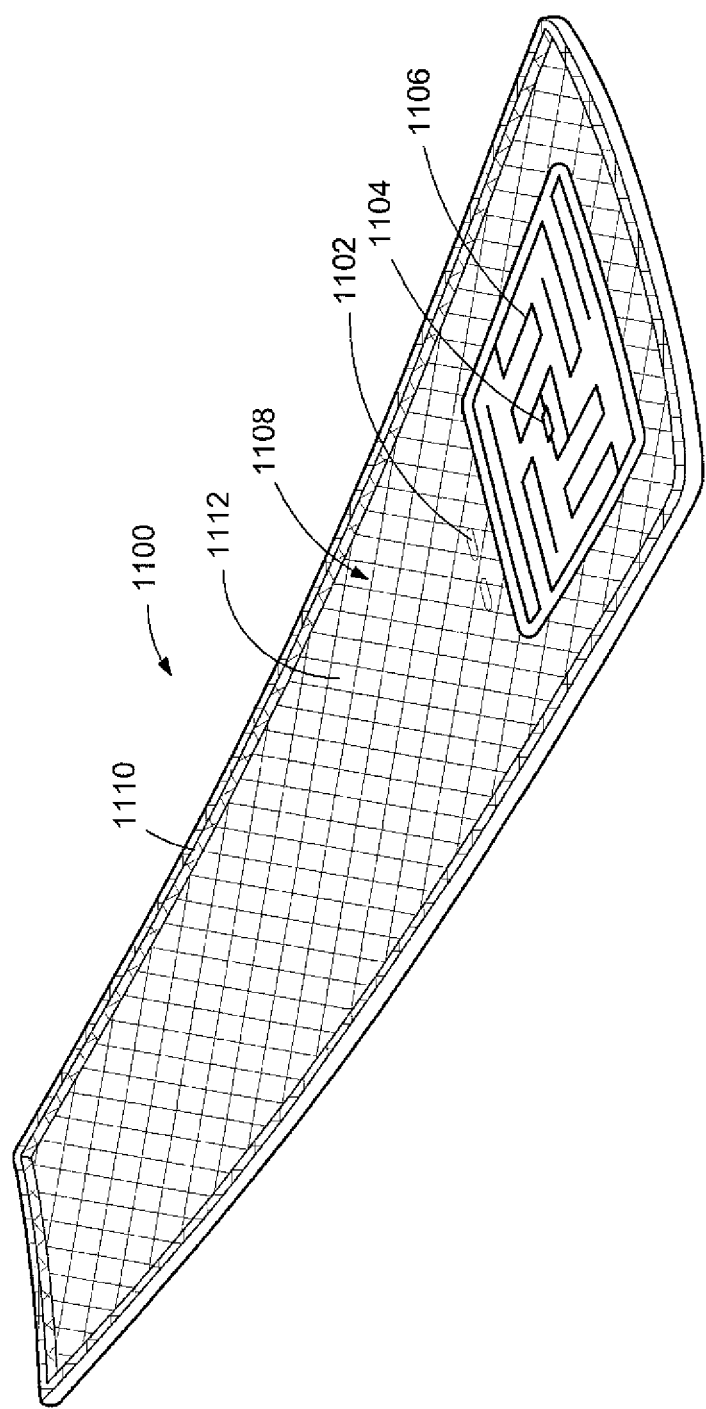
FIG. 11 depicts an article of manufacture including an RFID antenna and an in-molded electromagnetic shielding element.

FIG. 11 depicts an article of manufacture 1100 which serves as an RFID antenna 1106 and electromagnetic shielding layer 1108. The RFID antenna 1 106 and electromagnetic shielding layer 1108 are constructed of conductive ink printed on a formed film layer 1112 and is attached to a passive RFID circuit 1104. As shown in FIG. 11, an electromagnetic shielding layer 1108 is incorporated around the RFID antenna 1106 in this embodiment. This can be accomplished by printing one layer including both the electromagnetic shielding layer 1108 and the RFID antenna 1106 or by printing multiple layers separated a non-conductive layer such as a dielectric.

As shown in FIG. 11 a connection point 1102 (i.e., an exposed area of conductive ink) is provided on the surface of the film. As described above, connection point 1102 can be used to connect the RFID antenna and/or shielding element to another device, circuit or component. Connections to connection point 1004 can be made by, for example, a spring-clip connector, rivet connector, and the like. In addition, a pig-tail type connector as discussed above can by used as an alternative. Alternatively, connection point 1004 can be used to connect other conductive ink traces on the same printed and formed film layer 1112 (not shown). These additional traces can be printed on a layer separated by, for example, a non-conductive layer such as a dielectric layer.

Another shielding ink layer could be formed beneath the RFID antenna 1106 (not shown). This other shield would allow the RFID antenna 1106 to radiate away from the device while protecting the circuits or persons on the other side of the antenna from that radiation.

Film layer 1112 can be inserted in molded part 1110 such that the printed ink layer faces into a mold cavity (or B-side) and is not exposed after the molded part is formed. Alternatively, film layer 1010 can be inserted in molded part 1110 such that the printed ink layer faces the other way and is exposed.

In yet another embodiment, film layer 1112 can be inserted in-between the top and bottom of the molded part 1110 such that neither side is exposed or such that only a portion of the film is exposed.

Either side of the film layer 1112 can be disposed to the interior or exterior of the molded plastic part. Thus, in terms of the A and B-surfaces of the formed film layer 1112 and the molded part 1110, the A-surface or B-surface of the formed film layer 1112 can be disposed on the A-surface or B-surface of the molded plastic part 1110. Alternatively, the electromagnetic shielding layer 1108 may or may not be utilized. The electromagnetic shielding layer 1108 may have an opening for the RFID antenna 1106. Alternatively, electromagnetic shielding layer may completely cover RFID antenna 1106.

The present invention has been particularly shown and described with reference to the foregoing embodiments, which are merely illustrative of the best modes for carrying out the invention. It should be understood by those skilled in the art that various alternatives to the embodiments of the invention described herein may be employed in practicing the invention without departing from the spirit and scope of the invention as defined in the following claims. The embodiments should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

With regard to the processes, methods, heuristics, etc. described herein, it should be understood that although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes described herein are provided for illustrating certain embodiments and should in no way be construed to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. An electromagnetic shield, comprising:
   a film having a conductive ink shielding layer printed on a surface of said film; and
   a plastic support structure surrounding at least a portion of the film, wherein the film is secured to the plastic support structure.

2. The electromagnetic shield of claim 1, the surface of said film having an A-surface and a B-surface, wherein at least one of the A-surface and the B-surface of the film is secured to at least one of an A-surface and a B-surface of the plastic support structure.

3. The electromagnetic shield of claim 1, wherein said film is in-between a top of the plastic support structure and a bottom of the plastic support structure.

4. The electromagnetic shield of claim 1, wherein the film is secure to the plastic support structure to form a three dimensional object having a plurality of surfaces, the surfaces being at least one of a flat surface and a curved surface.

5. A resistive element, comprising:
   a film having a conductive ink resistive layer printed on a surface of said film; and
   a plastic support structure surrounding at least a portion of the film, wherein the film is secured to the plastic support structure.

6. The resistive element of claim 5, the surface of said film having an A-surface and a B-surface, wherein at least one of the A-surface and the B-surface of the film is secured to at least one of an A-surface and a B-surface of the plastic support structure.

7. The resistive element of claim 5, wherein said film is in-between a top of the plastic support structure and a bottom of the plastic support structure.

8. The resistive element of claim 5, wherein the film is secured to the plastic support structure to form a three dimensional object having a plurality of surfaces, the surfaces being at least one of a flat surface and a curved surface.

* * * * *